United States Patent
Kim et al.

(10) Patent No.: US 10,714,669 B2
(45) Date of Patent: Jul. 14, 2020

(54) THERMOELECTRIC MATERIAL AND METHOD FOR PREPARING THE SAME

(71) Applicants: Hyundai Motor Company, Seoul (KR); Kia Motors Corporation, Seoul (KR); Industry-Academic Cooperation Foundation, Yonsei University, Seoul (KR)

(72) Inventors: Byung Wook Kim, Gyeonggi-do (KR); Jin Woo Kwak, Gyeongsangbuk-do (KR); Woo Young Lee, Seoul (KR); Gwan Sik Kim, Gyeonggi-do (KR); Hyun Jun Rim, Seoul (KR)

(73) Assignees: Hyundai Motor Company, Seoul (KR); Kia Motors Corporation, Seoul (KR); Industry-Academic Cooperation Foundation, Yonsei University, Seoul (KR)

( * ) Notice: Subject to any disclaimer, the term of this patent is extended or adjusted under 35 U.S.C. 154(b) by 366 days.

(21) Appl. No.: 15/822,121

(22) Filed: Nov. 25, 2017

(65) Prior Publication Data

US 2019/0097111 A1    Mar. 28, 2019

(30) Foreign Application Priority Data

Sep. 26, 2017 (KR) .......................... 10-2017-0124310

(51) Int. Cl.
  *H01L 35/22* (2006.01)
  *H01L 35/16* (2006.01)
  *H01L 35/18* (2006.01)

(52) U.S. Cl.
  CPC .............. *H01L 35/22* (2013.01); *H01L 35/16* (2013.01); *H01L 35/18* (2013.01)

(58) Field of Classification Search
  CPC ...................................................... H01L 35/22
  See application file for complete search history.

(56) References Cited

U.S. PATENT DOCUMENTS

| 10,460,850 B2 * | 10/2019 | Kim ........................ C22C 47/14 |
| 2010/0059723 A1 | 3/2010 | Lee et al. |
| 2013/0269739 A1 | 10/2013 | Hwang et al. |
| 2018/0175270 A1 | 6/2018 | Kim et al. |

FOREIGN PATENT DOCUMENTS

| KR | 10-2010-0028909 | | 3/2010 |
| KR | 10-2013-0036638 | | 4/2013 |
| KR | 10-2013-0084120 | | 7/2013 |
| KR | 10-2016-0056991 | | 5/2016 |
| KR | 10-2017-0067457 | | 6/2017 |
| KR | 10-2018-0025666 A | | 3/2018 |
| KR | 10-2018-0069495 A | | 6/2018 |
| WO | WO 2016/076649 | * | 5/2016 |

* cited by examiner

*Primary Examiner* — C Melissa Koslow
(74) *Attorney, Agent, or Firm* — Mintz Levin Cohn Ferris Glovsky and Popeo, P.C.; Peter F. Corless

(57) ABSTRACT

Provided herein are a thermoelectric material and a method for preparing the same. The thermoelectric material may include a plurality of grains formed by a chemical bond between a first element and a second element, a graphene-based material; and metal particles. In particular, the graphene-based material and the metal particles may be in interfaces between the grains.

18 Claims, 7 Drawing Sheets

THERMOELECTRIC MATERIAL AND METHOD FOR PREPARING THE SAME

CROSS-REFERENCE TO RELATED APPLICATION

This application is based on and claims the benefit of priority to Korean Patent Application No. 10-2017-0124310, filed on Sep. 26, 2017 in the Korean Intellectual Property Office, the entire content of which is incorporated herein by reference.

TECHNICAL FIELD

The present invention relates to a thermoelectric material having improved mechanical properties (for example, fracture toughness), and a method for preparing the same.

BACKGROUND

A thermoelectric technology, such as thermoelectric power generation and thermoelectric cooling field, has been used to directly convert heat energy into electric energy or electric energy to heat energy in a solid state. As thermoelectric performance of a thermoelectric material used for thermoelectric power generation and thermoelectric cooling has been improved, performance of a thermoelectric module manufactured using the thermoelectric material may be further improved.

Examples of physical properties of the thermoelectric material determining the thermoelectric performance may include thermoelectromotive force (V), a Seebeck coefficient (S), a Peltier coefficient ($\pi$), a Thomson coefficient ($\tau$), a Nernst coefficient (Q), an Ettingshausen coefficient (P), electrical conductivity ($\sigma$), a power factor (PF), a figure of merit (Z), a dimensionless figure of merit $$(ZT = \frac{s^2 \sigma}{\kappa} T)$$

(T: absolute temperature)), thermal conductivity ($\kappa$), a Lorentz number (L), electric resistivity ($\rho$), and the like. Among them, a dimensionless figure of merit (ZT) may be an important physical property for determining thermoelectric conversion energy efficiency, and by using a thermoelectric material with a large figure of merit $$\left( Z = \frac{s^2 \sigma}{\kappa} \right),$$

power generation efficiency ana cooling efficiency may be increased when manufacturing a thermoelectric module. In other words, the higher the Seebeck coefficient and the electrical conductivity of the thermoelectric material may be able to provide the lower the thermal conductivity of the thermoelectric material thereby substantially improving thermoelectric performance of the thermoelectric material.

Currently, commercialized thermoelectric materials may include a Bi—Te based thermoelectric material for room-temperature applications, Pb—Te based and Mg—Si based thermoelectric materials for mid-temperature applications, a Fe—Si based thermoelectric material for high-temperature applications, and the like, based on the temperature for operating. However, since these thermoelectric materials have been mostly prepared by sintering metal powders, obtaining a thermoelectric material having excellent mechanical properties may be limited. Particularly, since the Mg—Si based thermoelectric material has low compressive strength due to brittleness, cracks may occur in the thermoelectric material during a process of manufacturing a thermoelectric module. Further, since the Mg—Si based thermoelectric material has low facture toughness as compared to other thermoelectric materials, the Mg—Si based thermoelectric material may not withstand impacts applied during a process of repetitively using the thermoelectric module, and may be broken, such that a lifetime of the thermoelectric module may be decreased.

SUMMARY

In preferred aspect, the present invention provides a thermoelectric material having excellent thermoelectric performance and improved compressive strength and fracture toughness if metal particles and graphene-based material exit in interface.

In one preferred aspect, provided is a thermoelectric material. The thermoelectric material may include: 1) a plurality of grains formed by a chemical bond between at least a first element and a second element; 2) a graphene-based material; and 3) metal particles. In particular embodiments, in the formed thermoelectric material, the graphene-based material and the metal particles may be meant or reside in the interfaces between the plurality of the grains.

The term "chemical bond" as used herein refers to a bond formed between metal element and metal element or between metal element and non-metal element. Exemplary chemical bond may include, but not limited to, a metallic bond to form an alloy such that the metal elements or metalloid may share conductive electrons therebetween, thereby providing thermoelectric properties to the material. In other exemplary thermoelectric material, the chemical bond may suitably include covalent bond, ionic bond, metallic bond and combinations thereof.

The first element may suitably be one or more selected from the group consisting of Mg, Bi, Co, Pb, Si, Zn, Al, and Mn and the second element may suitably be one or more selected from the group consisting of Si, Te, Se, Sb, and Ge.

In certain preferred aspect, the grain may have an average diameter of about 100 to 5,000 nm.

The graphene-based material may suitably include graphene oxide or reduced graphene oxide. In addition, the graphene-based material may have an average thickness of about 0.1 to 20 nm. A content of the graphene-based material may suitably be about 0.01 to 10 wt % based on 100 wt % of the thermoelectric material.

The metal particles may suitably include one or more selected from the group consisting of copper (Cu), aluminum (Al), tin (Sn), zinc (Zn), and zirconium (Zr). The metal particles may suitably have an average diameter of about 50 to 1000 nm. A content of the metal particles may suitably be about 0.01 to 10 wt % based on 100 wt % of the thermoelectric material.

In other preferred aspect, provided is a method for preparing the thermoelectric material described above. The method may include steps of: mixing i) at least a first powder comprising a first element and ii) a second powder comprising a second element to obtain a mixed powder; heating the mixed powder to obtain a first mixture; mixing a graphene-based material and a metal precursor powder with the first mixture to obtain a second mixture; and sintering the second mixture.

In such method, the first element may suitably be one or more selected from the group consisting of Mg, Bi, Co, Pb, Si, Zn, Al, and Mn and the second element may suitably be one or more selected from the group consisting of Si, Te, Se, Sb, and Ge.

In such method, the graphene-based material may suitably include graphene oxide or reduced graphene oxide. In addition, the graphene-based material may have an average thickness of about 0.1 to 20 nm. A content of the graphene-based material may suitably be about 0.01 to 10 wt % based on 100 wt % of the thermoelectric material.

In such method, the metal precursor powder may suitably include one or more selected from the group consisting of copper (Cu), aluminum (Al), tin (Sn), zinc (Zn), and zirconium (Zr). The metal precursor powder may include one or more selected from the group consisting of copper (Cu), aluminum (Al), tin (Sn), zinc (Zn), and zirconium (Zr). The metal precursor powder may suitably have an average diameter of about 50 to 1000 nm. A content of the metal precursor powder may suitably be about 0.01 to 10 wt % based on 100 wt % of the thermoelectric material.

Further provided herein is a thermoelectric device that may include the thermoelectric material as to described above.

Other aspects of the invention are disclosed infra.

BRIEF DESCRIPTION OF THE DRAWINGS

The above and other objects, features and advantages of the present invention will be more apparent from the following detailed description taken in conjunction with the accompanying drawings.

DETAILED DESCRIPTION

Figure 1A:
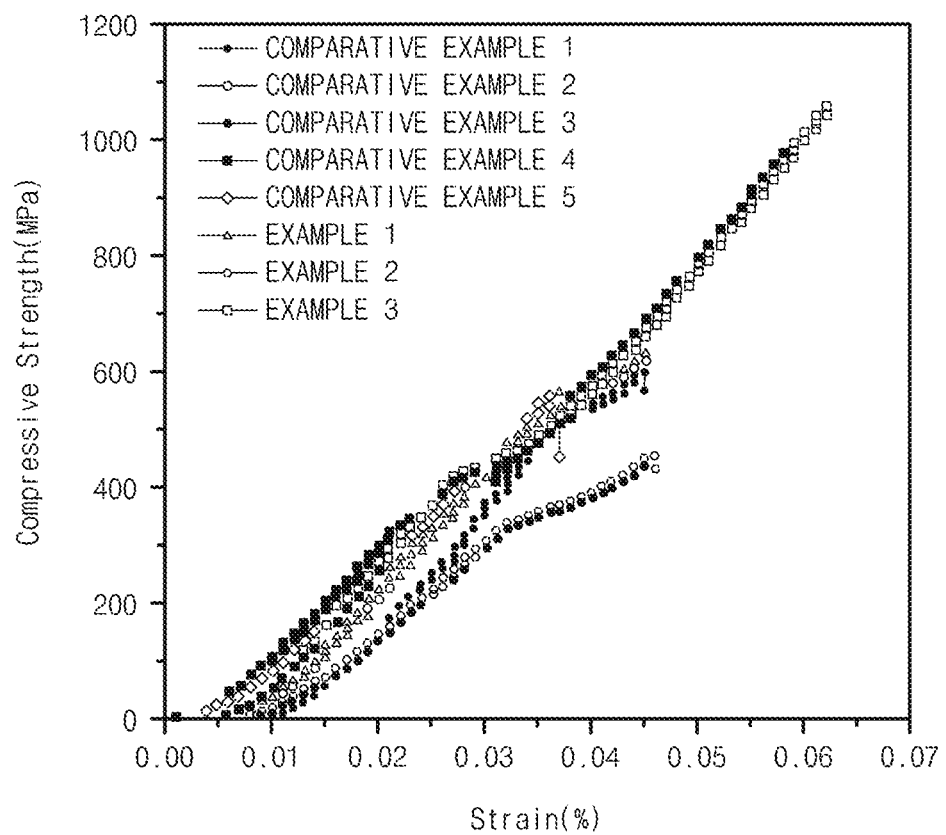
FIG. 1A is a graph of compressive strength of Examples and Comparative Examples according to exemplary embodiments of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprise", "include", "have", etc. when used in this specification, specify the presence of stated features, regions, integers, steps, operations, elements and/or components but do not preclude the presence or addition of one or more other features, regions, integers, steps, operations, elements, components, and/or combinations thereof.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Further, unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present invention, and will not be interpreted in an idealized or overly formal sense unless expressly so defined herein.

Hereinafter, the present invention will be described.

Since a thermoelectric material has been generally prepared by sintering a raw material powder, the thermoelectric material may contain a plurality of grains formed by binding (growth) of the raw material powder, and there may be a grain boundary between the plurality of grains. When impacts are repeatedly applied to the thermoelectric material as described above, cracks may occur in the grain boundary between the grains, having relatively weak binding force, which acts as a factor of deteriorating mechanical strength (for example, fracture toughness and compressive strength) of the thermoelectric material.

Therefore, the present invention relates to a thermoelectric material in which a graphene-based material and metal particles may be introduced into interfaces between grains, corresponding to positions in which cracks mainly occur, in order to improve mechanical strength of the thermoelectric material. A detailed description thereof will be provided below.

1. Thermoelectric Material

In one preferred aspect of the present invention, provided is a thermoelectric material.

The thermoelectric material may include i) a plurality of grains including at least first and second elements, a graphene-based material and metal particles.

The plurality of grains as described above may include a phase exhibiting thermoelectric properties through a chemical bond between the first and second elements or chemical bonds between two or more elements.

The graphene-based material and the metal particles contained in the thermoelectric material may be present in interfaces between the grains, for example, grain boundaries between the grains).

When the graphene-based material as described above may be present in the interface between the grains where cracks mainly occur, even though a linear crack occurs, progress of the crack may be efficiently prevented or blocked due to the graphene-based material, for example, a graphene-based material having a planar shape. Accordingly, a thermoelectric material having improved fracture toughness may be provided.

The graphene-based material may be graphene oxide (GO) or reduced graphene oxide (rGO). Further, the graphene-based material may have a planar shape.

A thickness of the graphene-based material is not particularly limited, but may be preferably about 0.1 to 20 nm. Further, a width and a length of the graphene-based material are not particularly limited, but may be each preferably about 150 to 1,000 nm. An aspect ratio of the graphene-based material may be about 10 to 5,000 depending on ranges of the thickness, the width, and the length of the graphene-based material. Particularly, the aspect ratio (L/t) of the graphene-based material may be calculated by dividing average value (average length, L) of the width and the length of the graphene-based material) by the thickness (t) of the graphene-based material.

When the thickness, the width, and the length of the graphene-based material are in the predetermined ranges, for example, the thickness of about 0.1 to 20 nm, the width or length of about 150 to 1,000 nm, sizes of the graphene-based material and the grain may be suitable, such that the graphene-based material may be stably positioned in the interface between the grains, and an effect of blocking the progress of the crack may be further improved. When the size of the graphene-based material is less than the predetermined size, for example, less than the predetermined thickness, width and length, and substantially smaller than that the grain, even though the graphene-based material is positioned in the interfaces between the grains, i the progress of the crack may not be prevented or blocked, and when the size of the graphene-based material is greater than the predetermined size, for example, less than the predetermined thickness, width and length, the graphene-based material may not be suitably positioned in the interface.

A ratio (L/d) of the average value (L) of the width and the length of the graphene-based material to a diameter (d) of the grain is not particularly limited, but may suitably be about 0.03 to 0.5. Further, a ratio (t/d) of the thickness (t) of the graphene-based material to the diameter (d) of the grain is not particularly limited, but may suitably be 0.0002 to 0.03.

A content of the graphene-based material is not particularly limited, but the content of the graphene-based material may suitably be 0.01 to 10 wt % based on 100 wt % of the thermoelectric material. When the content of the graphene-based material is less than about 0.01 wt %, an effect of improving fracture toughness of the thermoelectric material may not be obtained, and when the content of the graphene-based material is greater than about 10 wt %, thermoelectric performance of the thermoelectric material may be deteriorated.

Meanwhile, when a metal particle having conductivity is present together with the graphene-based material in the interface between the grains, a current movement path may be secured. In addition, electric resistance of the interface and electric resistance of the metal particles may be connected in parallel with each other, such that entire electric resistance of the thermoelectric material may be decreased. As such, electrical conductivity of the thermoelectric material may be increased. Further, as phonon scattering occurs and thus entire thermal resistance of the thermoelectric material may be increased. Therefore, according to various exemplary embodiments of the present invention, thermal conductivity of the thermoelectric material may be decreased.

In addition, since the metal particle may be positioned in the interface between the grains, the metal particle may serve as a buffer material even though external force is applied thereto, such that a thermoelectric material having improved compressive strength may be provided.

In order to improve electrical conductivity, thermal conductivity, and mechanical strength of the thermoelectric material, a content of the metal particle may suitably be about 0.01 to 10 wt % based on 100 wt % of the thermoelectric material. In other words, mechanical strength as well as electrical conductivity and thermal conductivity of the thermoelectric material may be all improved by adjusting the content of the metal particles to be in the above-mentioned range.

Further, a size (e.g. particle diameter) of the metal particle is not particularly limited, but for improving electrical conductivity, thermal conductivity, and mechanical strength of the thermoelectric material, the size of the metal particle may suitably be about 50 to 1000 nm.

A material capable of being used as the metal particle as described above is not particularly limited, but may suitably include one or more selected from the group consisting of copper (Cu), aluminum (Al), tin (Sn), zinc (Zn), and zirconium (Zr). The metal particle may be positioned in the interface between the grains without any mechanical or chemical bond with the graphene-based material.

The size of the grain is not particularly limited, but the grain may suitably have an average diameter (e.g. longer diameter) of 100 to 5,000 nm. When the average diameter of the grain is less than about 100 nm, a secondary phase may be formed, and when the average diameter of the grain is greater than about 5,000 nm, thermal conductivity may be increased and then a figure of merit (or ZT) may be decreased.

The first element is not particularly limited, but may suitably be one or more selected from the group consisting of Mg, Bi, Co, Pb, Zn, Si, Al, and Mn. Further, the second element is also not particularly limited, but may suitably be one or more selected from the group consisting of Si, Te, Se, Sb, and Ge. Exemplary composition of the chemically bonded first and second elements, include, for example, $Mg_xAl_{2-x}Si_yB_{1-y}$, when x is greater than 0 and less than 2 and y is greater than 0 and less than 1.

In the thermoelectric material according to various exemplary embodiment of the present invention as described above, doping agents may suitably include one or more selected from the group consisting of Bi, Sb, As, P, Te, Se, Ge, and Al, and may be further contained in the grain together with the first and second elements.

Examples of the thermoelectric material according to the present invention may include a binary thermoelectric material such as a Bi—Te based thermoelectric material, a Pb—Te based thermoelectric material, a Co—Sb based thermoelectric material, a Mg—Si based thermoelectric material, a Mn—Si based thermoelectric material, or a Fe—Si based thermoelectric material, a ternary thermoelectric material such as a BiTeSb based thermoelectric material, a MgSiSn based thermoelectric material, or a CeFeSb based thermoelectric material, and a quaternary or higher thermoelectric material such as a InCeCoSb based thermoelectric material.

2. Method for Preparing Thermoelectric Material

The present invention provides a method for preparing the above-mentioned thermoelectric material, and a detailed description thereof will be provided below.

a) Preparation of First Mixture

A first mixture may be prepared by mixing a first powder including a first element and a second powder including a second element, for example to form a mixed powder, and heating the mixed powder. The first element in the first powder is not particularly limited but may suitably include one or more elements (e.g. metal, or metalloid) selected from the group consisting of Mg, Bi, Co, Pb, Zn, Si, Al, and Mn, and the second element in the second powder may suitably include one or more elements (e.g. metal, or metalloid) selected from the group consisting of Si, Te, Se, Sb, and Ge. The first powder and the second powder may be mixed with each other by a method known in the related art. For example, the mixed powder having a particle diameter of about 50 μm or less may be prepared by a ball milling method.

b) Preparation of Second Mixture

A second mixture may be prepared by mixing the first mixture with a graphene-based material and a metal precursor powder.

A material capable of being used as the graphene-based material is not particularly limited, but a powder which may suitably include a carbon crystal structure that may include an oxide functional group by oxidation may be partially contained may be used.

A material as the metal precursor powder is not particularly limited, but the metal precursor powder may suitably include one or more selected from the group consisting of copper acetate powder, zinc acetate powder, aluminum acetate powder, zirconium acetate powder, and tin acetate powder.

A content of the graphene-based material is not particularly limited, but the content of the graphene-based material may suitably be about 0.01 to 10 wt % based on 100 wt % of the thermoelectric material. A content of the metal precursor powder is not particularly limited, but the content of the metal precursor powder may suitably be about 0.01 to 10 wt % based on 100 wt % of the thermoelectric material.

The mixing of the first mixture, the graphene-based material, and the metal precursor powder may be performed under a dry condition. For instance, the mixing may be performed under a wet condition by adding an organic solvent. As the organic solvent is added, oxidation and contaminations of the graphene-based material and the metal precursor powder may be prevented, and dispersibility of the first mixture, the graphene-based material, and the metal precursor powder may be improved. The organic solvent is not particularly limited as long as it is known in the related art. For example, the organic solvent may suitably include ethanol, acetone, toluene, or a mixed solvent thereof.

c) Sintering

The thermoelectric material according to various exemplary embodiments of the present disclosure may be prepared by injecting the second mixture into a mold and sintering the second mixture. A method for sintering the second mixture is not particularly limited as long as it is known in the related art. For example, a hot press method, a spark plasma sintering method, or the like, may be suitably used. Further, sintering conditions are not particularly limited, but to obtain a suitable density of the thermoelectric material, the sintering may be performed at a temperature of about 600 to 900° C. for about 3 minutes to 1 hour under a pressure of about 30 to 90 MPa.

3. Thermoelectric Device

The present invention also provides a thermoelectric device including the thermoelectric material as described herein. In particular, the thermoelectric device may be formed to have a predetermined shape (for example, a rectangular parallelepiped shape) through a process of cutting and/or processing the above-mentioned thermoelectric material, etc.

The thermoelectric device may be a p-type thermoelectric device or n-type thermoelectric device.

As this thermoelectric device is bonded to an electrode to thereby be modularized, the thermoelectric device may be applied to a thermoelectric cooling system capable of exhibiting a cooling effect by application of a current, or a thermoelectric power generation system capable of exhibiting a power generation effect by a temperature difference.

Hereinafter, the present invention will be described in detail below through Examples. However, the following Examples are to illustrate the present invention, and the scope of the present invention is not limited to the following Examples.

EXAMPLE

Example 1

Raw material powders in which Mg powder (58.44 g), Si powder (32.76 g), Bi powder (7.50 g), and Al powder (1.30 g) were mixed with each other was subjected to heat treatment under vacuum. Then, heat treatment was performed so that Al and Bi were doped in an Mg-site and a Si-site respectively, and an $Mg_2Si$ phase was formed by the doped Mg and Si, thereby preparing a first mixture having a composition of $Mg_{1.96}Al_{0.04}Si_{0.97}Bi_{0.03}$. Tin acetate was mixed with the first mixture (10 g) subjected to heat treatment so that a content of copper (Cu) acetate powder was 0.6 wt % based on a total weight of a finally prepared thermoelectric material, followed by ball milling (SPEX, 8000D) for 5 minutes, thereby preparing a powder having a particle diameter of 50 μm or less.

Reduced graphene oxide (rGO) was added to and re-mixed with the powder so that a content of the reduced graphene oxide was 3 wt % based on the total weight of the finally prepared thermoelectric material, thereby preparing a second mixture. The second mixture was subjected to reduction heat treatment at a temperature of 350° C. for 2 hours in the presence of mixed gas ($N_2$ (95 vol %)+$H_2$ (5 vol %)).

Next, the second mixture subjected to reduction heat treatment was injected into a mold and subjected to spark plasma sintering, thereby preparing a thermoelectric material. The spark plasma sintering was performed under vacuum, a sintering temperature was about 750° C., a sintering pressure was 40 MPa, and a sintering time was 5 minutes.

Example 2

A thermoelectric material was prepared by the same method as in Example 1 except for adding 0.6 wt % of aluminum (Al) acetate.

Example 3

A thermoelectric material was prepared by the same method as in Example 1 except for adding 0.6 wt % of tin (Sn) acetate.

Example 4

A thermoelectric material was prepared by the same method as in Example 1 except for adding 2 wt % of rGO.

Example 5

A thermoelectric material was prepared by the same method as in Example 1 except for adding 2 wt % of rGO and 0.6 wt % of aluminum (Al) acetate.

Example 6

A thermoelectric material was prepared by the same method as in Example 1 except for adding 2 wt % of rGO and 0.6 wt % of tin (Sn) acetate.

Example 7

A thermoelectric material was prepared by the same method as in Example 1 except for adding 1 wt % of rGO.

Example 8

A thermoelectric material was prepared by the same method as in Example 1 except for adding 1 wt % of rGO and 0.6 wt % of aluminum (Al) acetate.

Example 9

A thermoelectric material was prepared by the same method as in Example 1 except for adding 1 wt % of rGO and 0.6 wt % of tin (Sn) acetate.

COMPARATIVE EXAMPLE

Comparative Example 1

Raw material powders in which Mg powder (58.44 g), Si powder (32.76 g), Bi powder (7.50 g), and Al powder (1.30 g) were mixed with each other was subjected to heat treatment under vacuum. Here, heat treatment was performed so that Al and Bi were doped in an Mg-site and a Si-site, respectively, and an $Mg_2Si$ phase was formed by doped Mg and Si, thereby preparing a raw material powder having a composition of $Mg_{1.96}Al_{0.04}Si_{0.97}Bi_{0.03}$. The raw material powder subjected to heat treatment was ball-milled (SPEX, 8000D) for 5 minutes, thereby preparing a mixed powder having a particle diameter of 50 μm or less.

Comparative Example 2

Raw material powders in which Mg powder (58.44 g), Si powder (32.76 g), Bi powder (7.50 g), and Al powder (1.30 g) were mixed with each other was subjected to heat treatment under vacuum. Then, heat treatment was performed so that Al and Bi were doped in an Mg-site and a Si-site, respectively, and an $Mg_2Si$ phase was formed by the doped Mg and Si, thereby preparing a raw material powder having a composition of $Mg_{1.96}Al_{0.04}Si_{0.97}Bi_{0.03}$. Copper acetate was mixed with the raw material powder (10 g) subjected to heat treatment so that a content of copper (Cu) acetate was 0.6 wt % based on a total weight of a finally prepared thermoelectric material, followed by ball milling (SPEX, 8000D) for 5 minutes, thereby preparing a mixed powder having a particle diameter of 50 μm or less.

The mixed powder was subjected to reduction heat treatment at a temperature of 350° C. for 2 hours in the presence of mixed gas ($N_2$ (95 vol %)+$H_2$ (5 vol %)).

Next, the mixture subjected to reduction heat treatment was injected into a mold and subjected to spark plasma sintering, thereby preparing a thermoelectric material. The spark plasma sintering was performed under vacuum, a sintering temperature was about 750° C., a sintering pressure was 40 MPa, and a sintering time was 5 minutes.

Comparative Example 3

A thermoelectric material was prepared by the same method as in Example 2 except for adding 0.6 wt % of aluminum (Al) acetate.

Comparative Example 4

A thermoelectric material was prepared by the same method as in Example 2 except for adding 0.6 wt % of Tin (Sn) acetate.

Comparative Example 5

Raw material powders in which Mg powder (58.44 g), Si powder (32.76 g), Bi powder (7.50 g), and Al powder (1.30 g) are mixed with each other was heat-treated under vacuum. Here, heat treatment was performed so that Al and Bi were doped in an Mg-site and a Si-site, respectively, and an $Mg_2Si$ phase was formed by the doped Mg and Si, thereby preparing a raw material powder having a composition of $Mg_{1.96}Al_{0.04}Si_{0.97}Bi_{0.03}$. The raw material powder subjected to heat treatment was ball-milled (SPEX, 8000D) for 5 minutes, thereby preparing a mixed powder having a particle diameter of 50 μm or less.

Reduced graphene oxide was added to and mixed with the mixed powder (10 g) so that a content of the reduced graphene oxide was 3 wt % based on the total weight of a finally prepared thermoelectric material, thereby preparing a mixture.

Next, the prepared mixture was injected into a mold and subjected to spark plasma sintering, thereby preparing a thermoelectric material. The spark plasma sintering was performed under vacuum, a sintering temperature was about 750° C., a sintering pressure was 40 MPa, and a sintering time was 5 minutes.

Experimental Example

Experimental Example 1 (Evaluation of Fracture Toughness ($K_c$))

A pyramidal indenter was compressed with a force of 2.942 N on the thermoelectric materials prepared in Examples 1 to 9 and Comparative Examples 1 to 5, respectively, thereby generating cracks in the thermoelectric materials. Thereafter, fracture toughness was evaluated based on the following Equation 1, and the results were illustrated in FIG. 1B and FIG. 3.

$$K_c = \alpha \left(\frac{E}{H}\right)^{0.5} \times \frac{P}{c^{1.5}} \quad \text{[Equation 1]}$$

P: applied load
E: Young's modulus

H: Vickers hardness
c: radial crack length
α: calibration constant

Figure 1B:
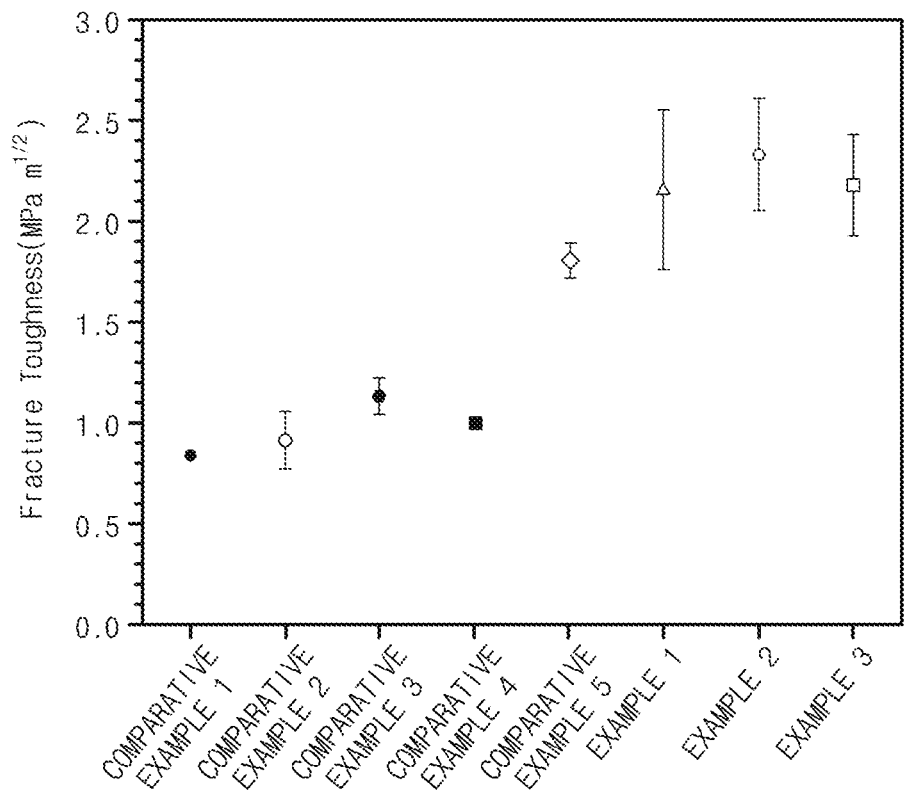
FIG. 1B is a graph of fracture toughness of Examples and Comparative Examples according to exemplary embodiments of the present invention.
Figure 3:
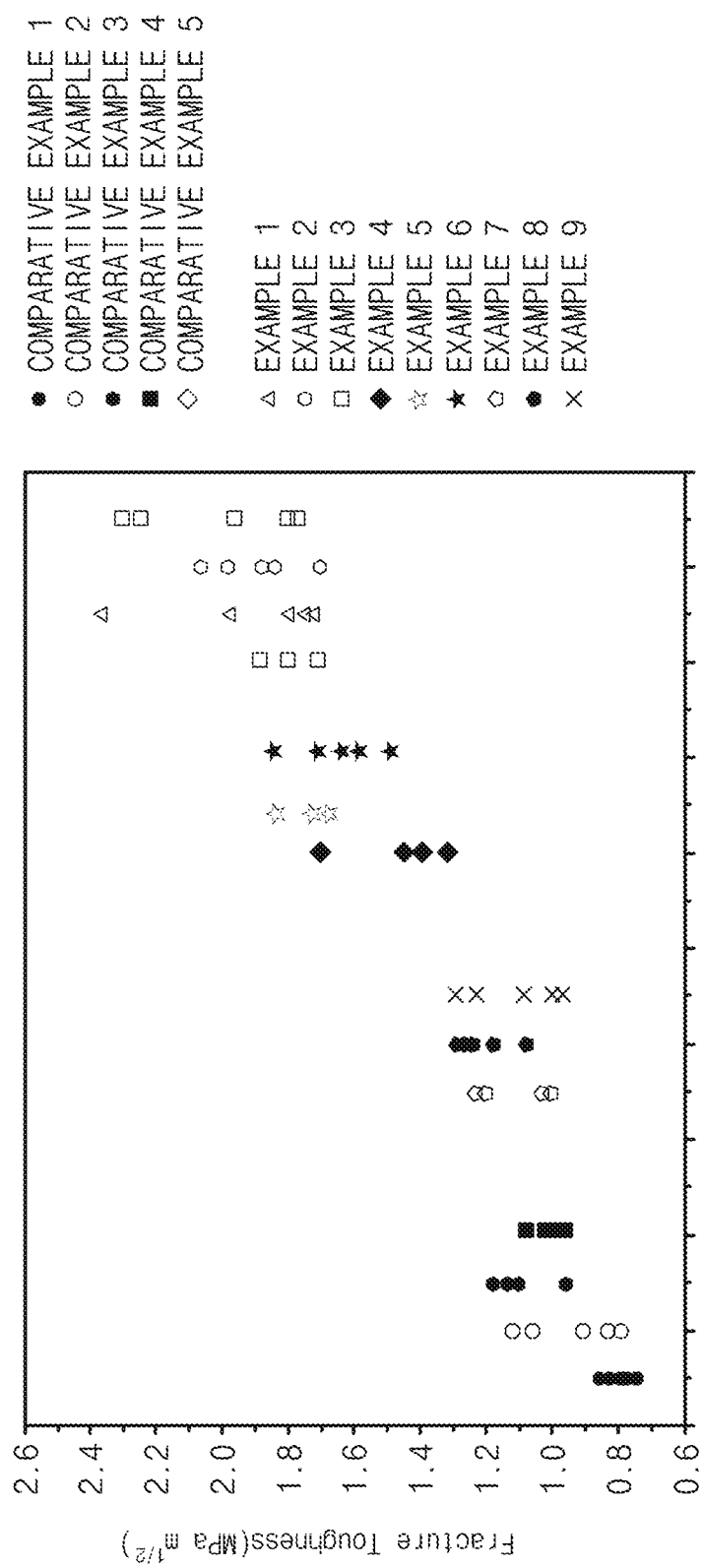
FIG. 3 is a graph of fracture toughness of Examples and Comparative Examples according to exemplary embodiments of the present invention.

Referring to FIGS. 1B and 3, in the thermoelectric materials of Examples corresponding to the thermoelectric material according various exemplary embodiments to the present invention, fracture toughness was improved as compared to Comparative Examples.

Experimental Example 2 (Evaluation of Compressive Strength)

After injecting each of the thermoelectric materials prepared in Examples 1 to 3 and Comparative Examples 1 to 5 into a quartz pipe and repeating movement of temperature sections corresponding to room temperature and at a temperature of 600° C. 50 times to apply thermal shock thereto, compressive strength was evaluated. The results were illustrated in FIG. 1A.

Referring to FIG. 1A, it may be confirmed that in the thermoelectric materials of Examples corresponding to the thermoelectric material according to the present invention, compressive strength was improved as compared to Comparative Examples.

Experimental Example 3 (Evaluation of Thermoelectric Performance)

Physical properties of the thermoelectric materials prepared in Examples 1 to 3 and Comparative Examples 1 to 5, respectively, were evaluated by the following methods.

Figure 2A:
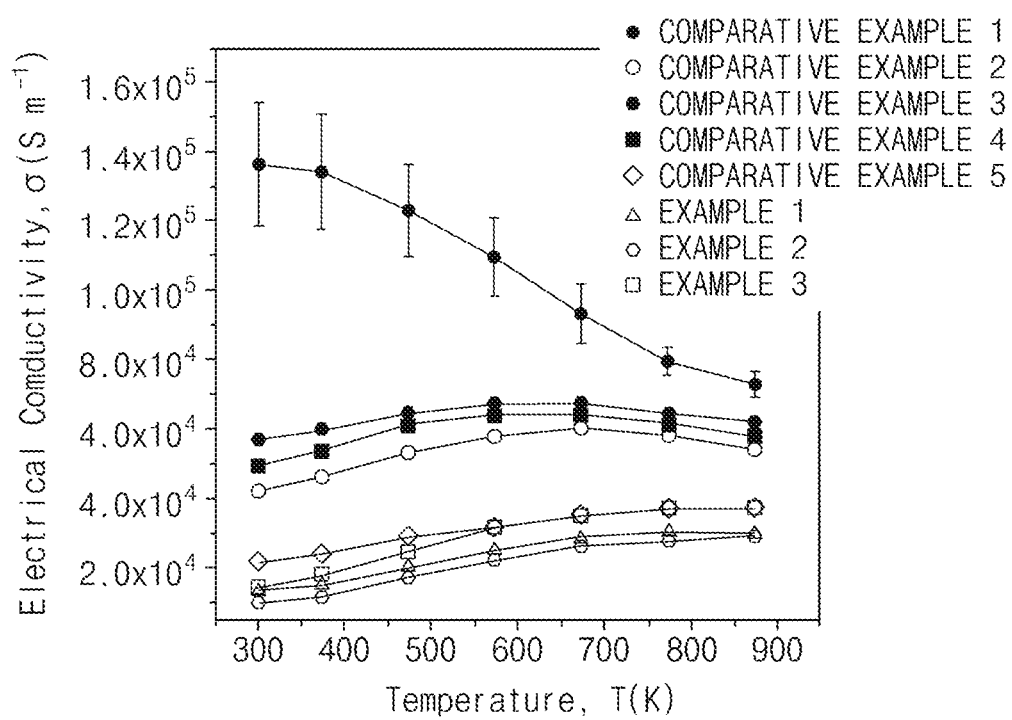
FIG. 2A is a graph of electrical conductivity of Examples and Comparative Examples according to exemplary embodiments of the present invention.

1. Electrical conductivity Electrical conductivity was measured by a four point method, and the results were illustrated in FIG. 2A.

Figure 2B:
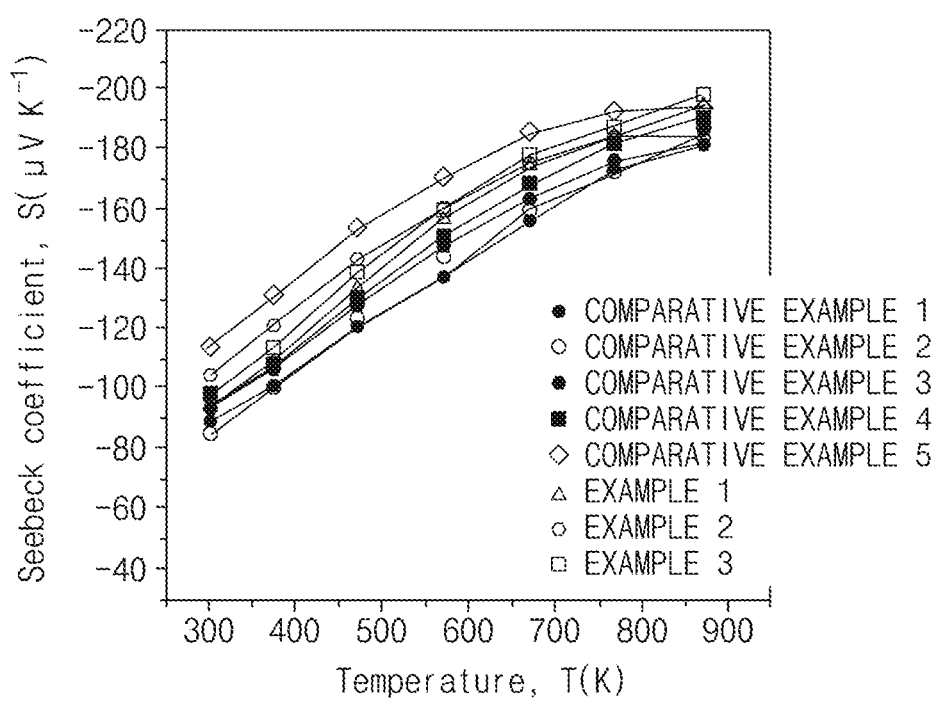
FIG. 2B is a graph of Seebeck coefficients of Examples and Comparative Examples according to exemplary embodiments of the present invention.

2. Seebeck coefficient: Seebeck coefficients were measured using Ulvac ZEM-3, and the results were illustrated in FIG. 2B.

Figure 2C:
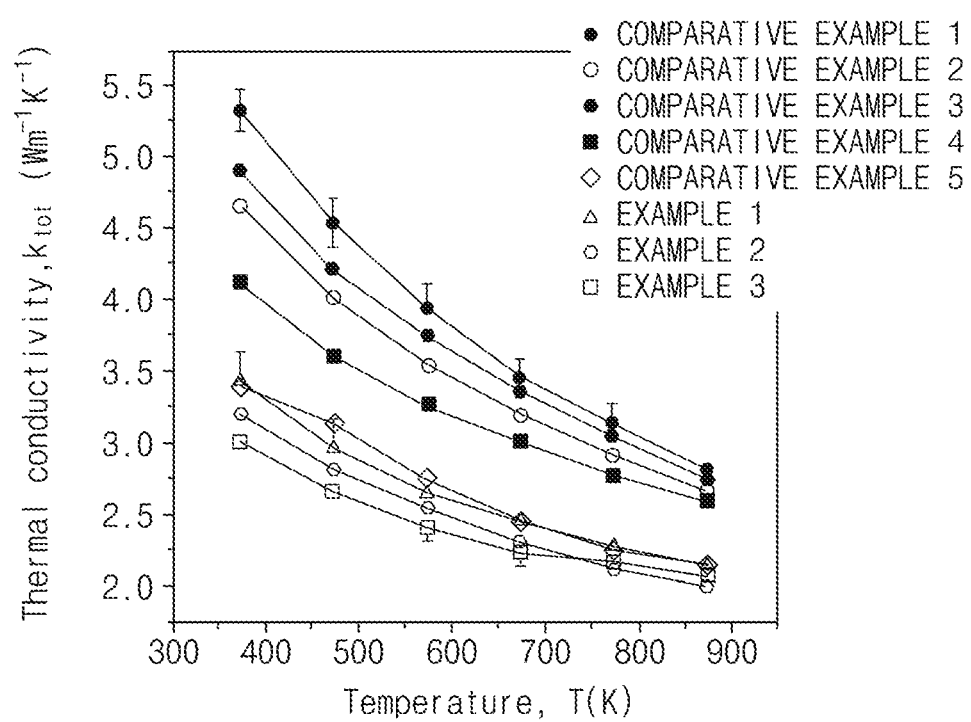
FIG. 2C is a graph of thermal conductivity of Examples and Comparative Examples according to exemplary embodiments of the present invention.

3. Thermal conductivity: Thermal conductivity was measured by laser flash analyzer (LFA), and the results were illustrated in FIG. 2C.

Figure 2D:
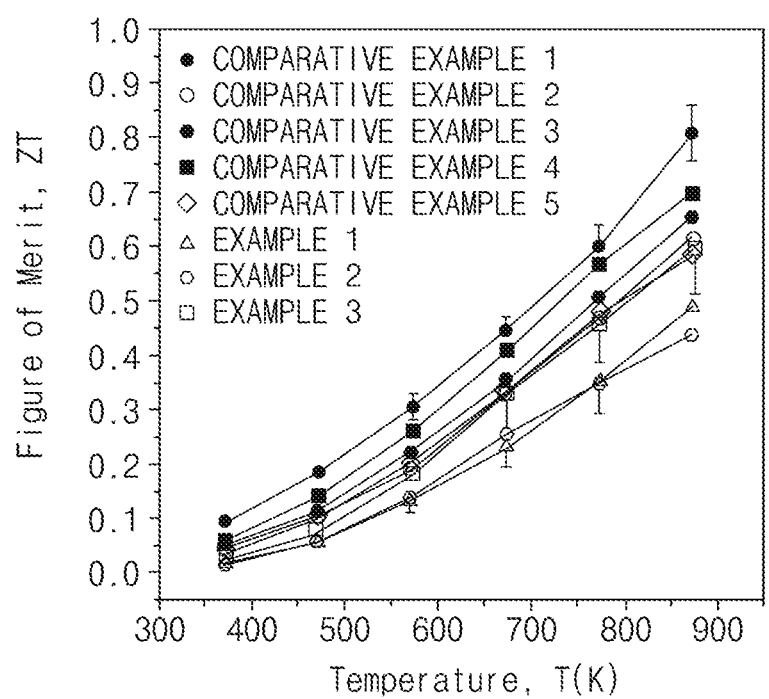
FIG. 2D is a graph of thermoelectric performance of Examples and Comparative Examples according to exemplary embodiments of the present invention.

4. Dimensionless figure of merit (ZT): Dimensionless figures of merit (ZT) were calculated using the following Equation 2, and the results were illustrated in FIG. 2D.

$$ZT = \frac{s^2 \sigma}{\kappa} T \qquad \text{[Mathematical Equation 2]}$$

(S: Seebeck coefficient, σ: electrical conductivity, κ: thermal conductivity, T: absolute temperature)

As shown in FIGS. 2A to 2D, in the thermoelectric materials of Examples 1 to 3 corresponding to the thermoelectric material according to the present invention, thermal performance was equal to or greater than that in Comparative Examples 1 to 5.

As described above, according to various exemplary embodiments of the present invention, since the graphene-based material capable of blocking the progress of cracks and the metal particles performing a buffering action against external force may be present in the interfaces between the grains, the thermoelectric material according to the present invention may have advantages. For instance, thermal conductivity of the thermoelectric material may be substantially reduced, and electrical conductivity, compressive strength, and fracture toughness may be substantially improved.

Hereinabove, although the present invention has been described with reference to exemplary embodiments and the accompanying drawings, the present invention is not limited thereto, but may be variously modified and altered by those skilled in the art to which the present invention pertains without departing from the spirit and scope of the present invention claimed in the following claims.

What is claimed is:

1. A thermoelectric material comprising:
    a plurality of grains formed by a chemical bond between at least a first element and a second element;
    a graphene-based material; and
    metal particles,
    wherein the graphene-based material and the metal particles are in interfaces between the grains,
    wherein the metal particles have an average diameter of about 50 to 1000 nm.

2. The thermoelectric material of claim 1, wherein the first element is one or more selected from the group consisting of Mg, Bi, Co, Pb, Si, Zn, Al, and Mn.

3. The thermoelectric material of claim 1, wherein the second element is one or more selected from the group consisting of Si, Te, Se, Sb, and Ge.

4. The thermoelectric material of claim 1, wherein the grain has an average diameter of about 100 to 5,000 nm.

5. The thermoelectric material of claim 1, wherein the graphene-based material comprises graphene oxide or reduced graphene oxide.

6. The thermoelectric material of claim 5, wherein the graphene-based material has an average thickness of about 0.1 to 20 nm.

7. The thermoelectric material of claim 1, wherein a content of the graphene-based material is about 0.01 to 10 wt % based on 100 wt % of the thermoelectric material.

8. The thermoelectric material of claim 1, wherein the metal particles comprises one or more selected from the group consisting of copper (Cu), aluminum (Al), tin (Sn), zinc (Zn), and zirconium (Zr).

9. The thermoelectric material of claim 1, wherein a content of the metal particles is about 0.01 to 10 wt % based on 100 wt % of the thermoelectric material.

10. A method for preparing a thermoelectric material, comprising:
    mixing at least a first powder comprising a first element and a second powder comprising a second element to obtain a mixed powder and heating the mixed powder to obtain a first mixture;
    mixing a graphene-based material and a metal precursor powder with the first mixture to obtain a second mixture; and
    sintering the second mixture.

11. The method of claim 10, wherein the first element comprises one or more selected from the group consisting of Mg, Bi, Co, Pb, Si, Zn, Al, and Mn.

12. The method of claim 10, wherein the second element comprises one or more selected from the group consisting of Si, Te, Se, Sb, and Ge.

13. The method of claim 10, wherein the graphene-based material comprises graphene oxide or reduced graphene oxide.

14. The method of claim 10, wherein a content of the graphene based material is about 0.01 to 10 wt % based on 100 wt % of the thermoelectric material.

15. The method of claim 10, wherein the metal precursor particles comprises one or more selected from the group consisting of copper (Cu), aluminum (Al), tin (Sn), and zirconium (Zr).

16. The method of claim 10, wherein the metal precursor powder has an average diameter of about 50 to 1000 nm.

17. The method of claim 10, wherein a content of the metal precursor powder is about 0.01 to to 10 wt % based on 100 wt % of the thermoelectric material.

18. A thermoelectric device comprising the thermoelectric material of claim 1.

* * * * *